US008294184B2

(12) United States Patent
Kothari et al.

(10) Patent No.: US 8,294,184 B2
(45) Date of Patent: Oct. 23, 2012

(54) EMS TUNABLE TRANSISTOR

(75) Inventors: Manish Kothari, San Jose, CA (US); Alok Govil, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 33 days.

(21) Appl. No.: 13/033,423

(22) Filed: Feb. 23, 2011

(65) Prior Publication Data
US 2012/0212289 A1    Aug. 23, 2012

(51) Int. Cl.
*H01L 29/772* (2006.01)
(52) U.S. Cl. ........ 257/213; 257/252; 257/254; 257/417; 257/415
(58) Field of Classification Search ............ 257/324, 257/347, E29.309, E27.112, 213, 254, 252, 257/417, 415
See application file for complete search history.

(56) References Cited

U.S. PATENT DOCUMENTS

| | | | |
|---|---|---|---|
| 4,812,888 A | 3/1989 | Blackburn | |
| 4,873,871 A | 10/1989 | Bai et al. | |
| 4,906,586 A | 3/1990 | Blackburn | |
| 4,954,789 A | 9/1990 | Sampsell | |
| 5,784,189 A | 7/1998 | Bozler et al. | |
| 6,040,937 A | 3/2000 | Miles | |
| 6,204,544 B1 | 3/2001 | Wang et al. | |
| 6,220,096 B1 | 4/2001 | Gutierrez et al. | |
| 6,574,033 B1 | 6/2003 | Chui et al. | |
| 6,661,637 B2 | 12/2003 | McIntosh et al. | |
| 6,674,562 B1 | 1/2004 | Miles et al. | |
| 6,724,023 B2* | 4/2004 | Heyers et al. ........... | 257/254 |
| 7,042,643 B2 | 5/2006 | Miles | |
| 7,123,216 B1 | 10/2006 | Miles | |
| 7,158,281 B2 | 1/2007 | Chen et al. | |
| 7,304,358 B2 | 12/2007 | Ancey et al. | |
| 7,327,510 B2 | 2/2008 | Cummings et al. | |
| 7,560,299 B2 | 7/2009 | Cummings | |
| 7,889,163 B2 | 2/2011 | Chui et al. | |
| 7,990,604 B2 | 8/2011 | Lee et al. | |
| 2002/0080554 A1 | 6/2002 | Chua et al. | |
| 2004/0026757 A1 | 2/2004 | Crane, Jr. et al. | |
| 2005/0122560 A1 | 6/2005 | Sampsell et al. | |
| 2005/0227428 A1 | 10/2005 | Mihai et al. | |
| 2006/0171097 A1 | 8/2006 | Shimanouchi et al. | |
| 2006/0245034 A1* | 11/2006 | Chen et al. ........... | 359/291 |
| 2008/0253057 A1 | 10/2008 | Rijks et al. | |
| 2008/0277718 A1* | 11/2008 | Ionescu et al. .......... | 257/324 |
| 2009/0128221 A1 | 5/2009 | Kam et al. | |
| 2010/0213546 A1 | 8/2010 | Liu et al. | |
| 2010/0245313 A1 | 9/2010 | Lewis et al. | |

FOREIGN PATENT DOCUMENTS

| | | |
|---|---|---|
| JP | 02-196472 | 8/1990 |
| JP | 2002-373829 | 12/2002 |
| WO | WO 03/007049 A1 | 1/2003 |
| WO | WO 03/073151 | 9/2003 |
| WO | WO 2004/026757 | 4/2004 |

OTHER PUBLICATIONS

Chau et al, Micromachined Devices and Components III, (Sep. 29, 1997) vol. 3224, pp. 314-324. Izumi et al., Development of MEMS Capacitive Sensor Using a Mosfet Structure, (2008) vol. 128, No. 3, pp. 102-107.
Segovia et al., A Novel Suspended Gate Mosfet Pressure Sensor, (May 2005), vol. 5836, pp. 363-368.
ISR and WO dated May 21, 2012 in PCT/US12/025081.

* cited by examiner

*Primary Examiner* — Michael Shingleton
(74) *Attorney, Agent, or Firm* — Knobbe Martens Olson & Bear LLP

(57) ABSTRACT

A field effect transistor comprises an electrostatically moveable gate electrode. The moveable gate is supported by at least two posts, and the source, drain, and channel of the transistor are centrally located under the moveable layer. At least one electrode is positioned on at least two sides of the source, drain, and channel.

27 Claims, 4 Drawing Sheets

EMS TUNABLE TRANSISTOR

TECHNICAL FIELD

This disclosure relates to electromechanical systems (EMS). More particularly, this disclosure relates to EMS devices used as transistors.

DESCRIPTION OF THE RELATED TECHNOLOGY

Electromechanical systems (EMS) include, for example, milli, micro, nano mechanical elements, actuators, and electronics. Electromechanical elements may be created using deposition, etching, and or other machining processes that etch away parts of substrates and/or deposited material layers or that add layers to form electrical and electromechanical devices. One type of EMS device is called a capacitive EMS device. As used herein, the term capacitive EMS device refers to a device which includes at least one layer which moves towards another layer. In certain implementations, a capacitive EMS device may include a pair of conductive plates, one or both of which may be transparent and/or reflective in whole or part and capable of relative motion upon application of an appropriate electrical signal. In a particular implementation, one plate may include a stationary layer deposited on a substrate and the other plate may include a metallic membrane separated from the stationary layer by an air gap. Such devices have a wide range of applications, and it would be beneficial in the art to utilize and/or modify the characteristics of these types of devices so that their features can be exploited in improving existing products and creating new products that have not yet been developed.

SUMMARY

In one implementation, the disclosure includes a field effect transistor including a moveable gate supported by at least two posts and configured to deform centrally between the at least two posts, a source, a drain, and a doped semiconductor channel disposed between the source and the drain and located under the movable gate. The transistor further includes one or more electrodes disposed on at least two sides of the source, the drain and the doped semi-conductor channel and configured to drive the moveable gate towards or away from the doped semi-conductor channel.

In another implementation, a method of operating a field effect transistor includes electrostatically moving a gate of the transistor toward a source, a drain and a doped semiconductor channel of the transistor, wherein the gate is supported by at least two posts and is configured to deform centrally towards the source, the drain, and the doped semiconductor channel, and wherein one or more electrodes are disposed on at least two sides of the source, the drain and the dope semi-conductor channel.

In another implementation, a field effect transistor includes a moveable gate supported by at least two posts and configured to deform centrally between the at least two posts, a source, a drain, a doped semi-conductor channel disposed between the source and the drain and located under the movable gate; and means for moving the gate towards or away from the doped semi-conductor channel, wherein the moving means is disposed on at least two sides of the source, the drain and the doped semi-conductor channel.

DETAILED DESCRIPTION

Figure 1:
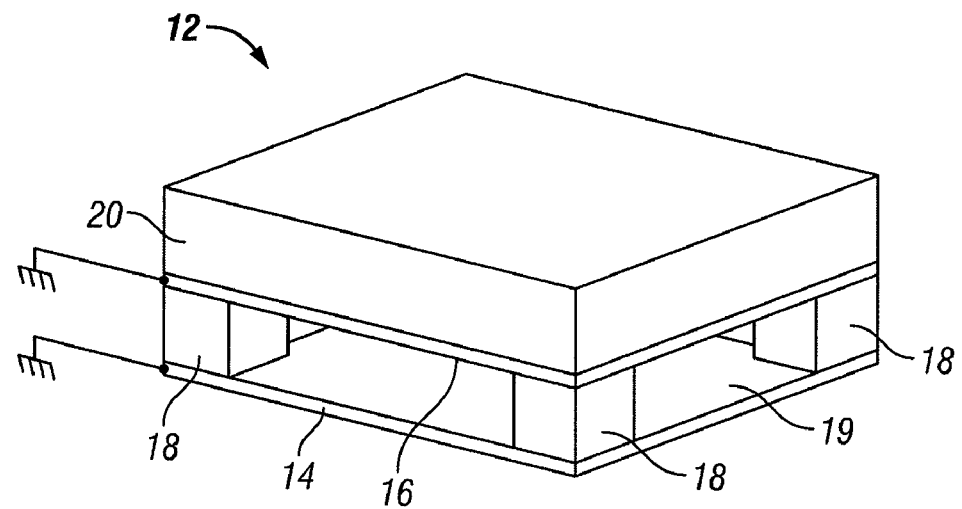
FIG. 1 is an isometric view of a capacitive EMS device in which a movable layer is in a relaxed position.
Figure 2:
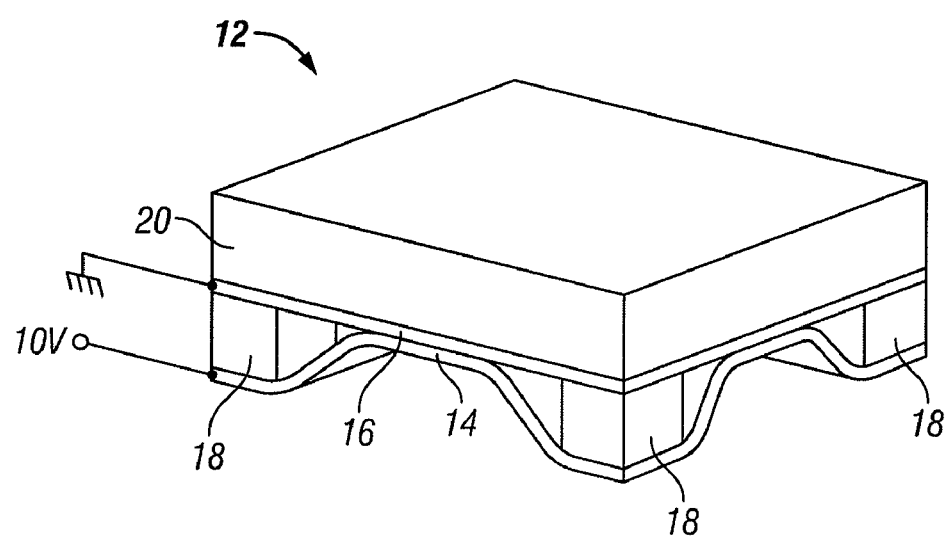
FIG. 2 is an isometric view of a capacitive EMS device in which a movable layer is in an actuated position.

FIGS. 1 and 2 are isometric views depicting a first implementation and a second implementation of a capacitive EMS device in which a movable layer of the capacitive EMS device as shown in FIG. 1 is in a relaxed position and a movable layer of the capacitive EMS device as shown in FIG. 2 is in an actuated position. In these implementations, the capacitive EMS devices are in either a "relaxed" or "actuated" state. In the "relaxed" (e.g., "open") state, the movable layer is positioned at a relatively large distance from a fixed layer. When in the "actuated" (e.g., "closed") state, the movable layer is positioned more closely adjacent to the fixed layer.

FIG. 1 is an isometric view depicting a portion of one implementation of a capacitive EMS device 12 in which a movable layer of a capacitive EMS device 12 is in a relaxed position. In some implementations, a consumer good or an electronic device, for example, may include a row/column array of these capacitive EMS devices. Each capacitive EMS device includes a pair of layers (e.g., a fixed layer and a movable layer) positioned at a variable and controllable distance from each other to form a resonant gap with at least one variable dimension. In one implementation, one of the layers (e.g., the movable layer) may be moved between two positions. In the first position shown in FIG. 1, referred to herein as the relaxed position, the movable layer is positioned at a relatively large distance from a fixed layer. In the second position shown in FIG. 2, referred to herein as the actuated position, the movable layer is positioned more closely adjacent to a fixed layer.

In the capacitive EMS device 12 shown in FIG. 1, a movable layer 14 is illustrated in a relaxed position at a predetermined distance from a conductive stack 16. In the capacitive EMS device 12 shown in FIG. 2, the movable layer 14 is illustrated in an actuated position adjacent to a stack 16.

The stack 16, as referenced herein, may include several fused layers, which can include a conductive electrode layer, such as aluminum or indium tin oxide (ITO), and a dielectric. The stack 16 is thus electrically conductive, may be partially transparent and partially reflective, and may be fabricated, for example, by depositing one or more of the above layers onto a substrate 20. In some implementations, the layers of the stack 16 may form one or more electrodes in an electronic device. The movable layer 14 may be one or more deposited metal layers formed on posts 18 and on top of an intervening sacrificial material (not shown) deposited between the posts 18. When the sacrificial material is etched away, the movable layer 14 is separated from the stack 16 by a defined gap 19. A highly conductive material such as aluminum may be used for the movable layer 14, and these may form one or more electrodes in an electronic device. Note that FIG. 1 may not be to scale. In some implementations, the spacing between posts 18 may be on the order of 10-100 um, while the gap 19 may be on the order of <1000 Angstroms.

With no applied voltage, the gap 19 remains between the movable layer 14 and stack 16, with the movable layer 14 in a mechanically relaxed state, as illustrated by the capacitive EMS device 12 in FIG. 1. However, when a potential (voltage) difference is applied between the stack 16 and the movable layer 14, the capacitive EMS device becomes charged in a manner similar to charging a capacitor, and electrostatic force acts on the stack 16 and movable layer 14. If the voltage is high enough, resulting in a correspondingly high electrostatic force, the movable layer 14 is deformed and is forced against the stack 16, as shown in FIG. 2. A dielectric layer (such as dielectric layer 17 shown in FIG. 3A) on top of the stack 16 (or on the movable layer 14) may prevent shorting and control the separation distance between layers 14 and 16, as illustrated by actuated capacitive EMS device 12 of FIG. 2. The behavior is the same regardless of the polarity of the applied potential difference. If the voltage is subsequently removed between the stack 16 and the movable layer 14, the movable layer 14 returns to a mechanically relaxed state as shown in FIG. 1. The moveable layer 14, acting like a spring, returns to the mechanically relaxed state due to a mechanical restorative force (i.e., a spring force) exerted by the moveable layer 14 due to its deflection.

In some implementations, the stack 16 can serve as a common electrode that provides a common voltage to one side of the capacitive EMS device of an electronic device. The movable layers may be formed as an array of separate plates arranged in, for example, a matrix form. The separate plates can be supplied with voltage signals for driving the capacitive EMS devices.

Figure 3A:
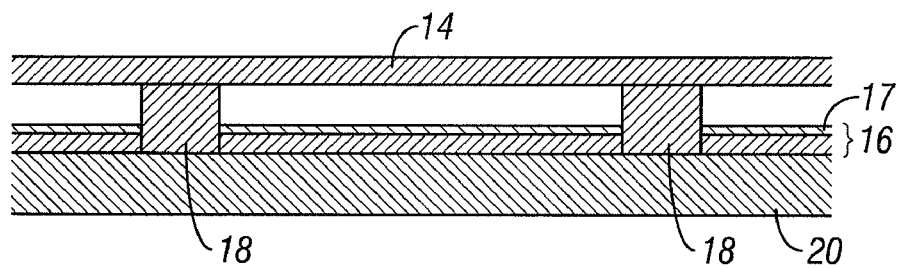
FIG. 3A is a cross section of the device of FIG. 1.
Figure 3B:
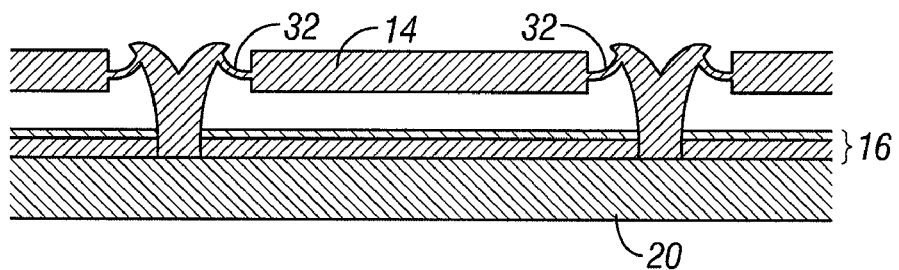
FIG. 3B is a cross section of one implementation of a capacitive EMS device.
Figure 3C:
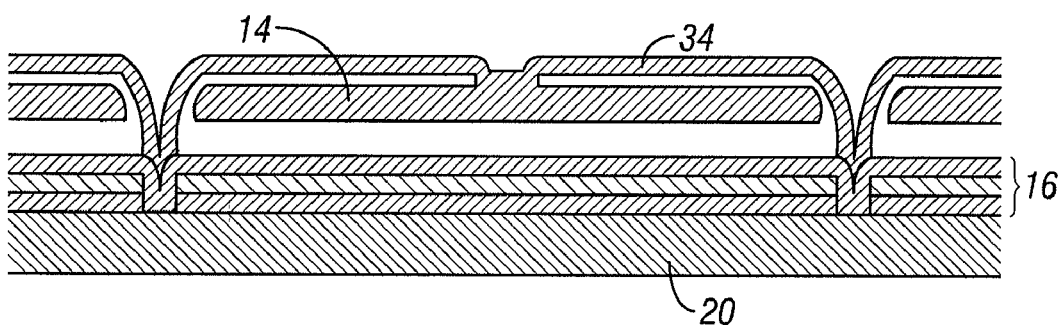
FIG. 3C is a cross section of one implementation of a capacitive EMS device.
Figure 3D:
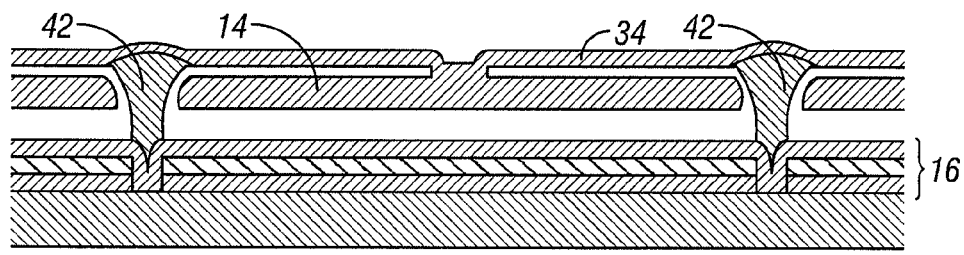
FIG. 3D is a cross section of one implementation of a capacitive EMS device.
Figure 3E:
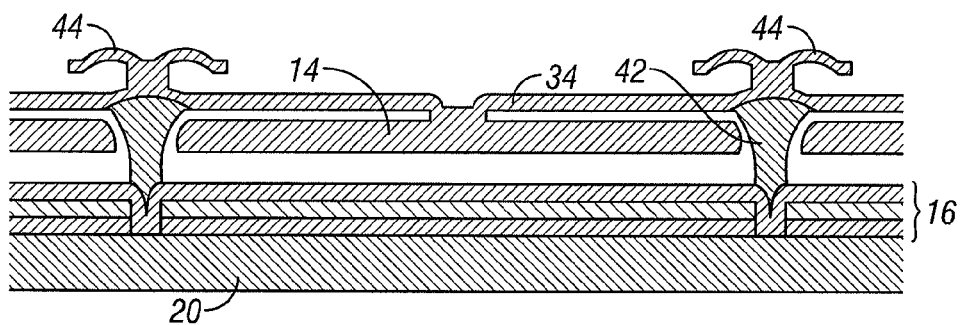
FIG. 3E is a cross section of one implementation of a capacitive EMS device.

The details of the structure of capacitive EMS devices that operate in accordance with the principles set forth above may vary widely. For example, FIGS. 3A-3E illustrate five different implementations of the movable layer 14 and its supporting structures. FIG. 3A is a cross section of the implementation of FIG. 1, where a strip of metal material 14 is deposited on orthogonally extending supports 18. In FIG. 3B, the moveable layer 14 of each capacitive EMS device is square or rectangular in shape and attached to supports at the corners only, on tethers 32. In FIG. 3C, the moveable layer 14 may be square or rectangular in shape and suspended from a deformable layer 34, which may include a flexible metal. The deformable layer 34 connects, directly or indirectly, to the substrate 20 around the perimeter of the deformable layer 34. These connections are herein referred to as support posts. The implementation illustrated in FIG. 3D has support post plugs 42 upon which the deformable layer 34 rests. The movable layer 14 remains suspended over the gap, as in FIGS. 3A-3C, but the deformable layer 34 does not form the support posts by filling holes between the deformable layer 34 and the stack 16, or fixed layer. Rather, the support posts are formed of a planarization material, which is used to form support post plugs 42. The implementation illustrated in FIG. 3E is based on the implementation shown in FIG. 3D, but may also be adapted to work with any of the implementations illustrated in FIGS. 3A-3C as well as additional implementations not shown. In the implementation shown in FIG. 3E, an extra layer of metal or other conductive material has been used to form a bus structure 44. This allows signal routing along the back of the capacitive EMS devices, eliminating a number of electrodes that may otherwise have had to be formed on the substrate 20 or elsewhere.

Capacitive EMS devices (such as the ones illustrated in FIGS. 1 and 2) may be used in a variety of electronic devices. For example, capacitive EMS devices are used in displays, where the movement/deformation of the movable layer may be used to vary at least one of the wavelength, color, and frequency of light waves which may be reflected by the capacitive EMS device.

Capacitive EMS devices may also be used as transistors or may be used as parts of transistors. In the implementations described herein, the moveable layer of a capacitive EMS device is used as a gate electrode of a field effect transistor.

Figure 4:
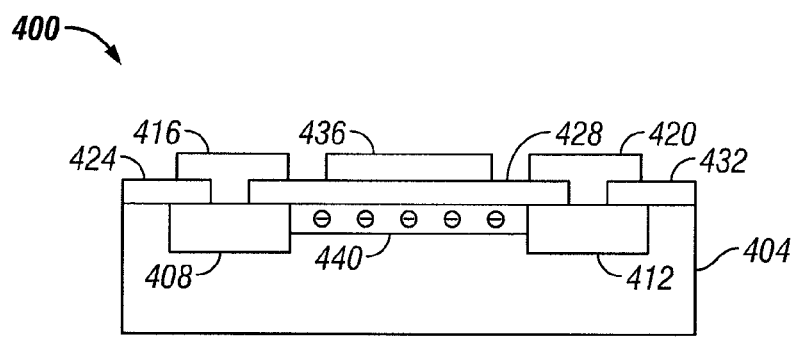
FIG. 4 is a diagram of an exemplary transistor including a capacitive EMS device.

FIG. 4 is a diagram of an exemplary field effect transistor 400. The transistor 400 may include a metal-oxide-semiconductor field-effect transistor (MOSFET). The transistor 400 may be used for a variety of functions including but not limited to amplifying and/or switching electronic signals. In one implementation, the transistor 400 may be an N-type transistor including a P-substrate 404 (e.g., a positive type substrate). The transistor 400 also includes two N-type (e.g., negative type) regions 408 and 412, which are located within the P-substrate 404. The N-type region 408 is coupled to a source terminal 416. The source terminal 416 may be coupled to a voltage source (not shown in figure). The N-type region 412 may be coupled to a drain terminal 420. The transistor 400 also includes insulating regions 424, 428, and 432 which are positioned above the P-substrate 404 and the N-type regions 408 and 412. A gate 436 is positioned above the insulating region 428 and between source terminal 416 and drain terminal 420. The gate 436 may be coupled to a voltage source (not shown in this figure). A conductive channel 440 is positioned between the N-type regions 408 and 412. The conductivity of the transistor 400 is dependent, at least in part, on the voltage applied to the gate 436 and the distance between the gate 436 and the channel 440.

Although FIG. 4 is directed towards an N-type transistor, the implementations described herein may be applicable to P-type transistors. A P-type transistor is similar to the N-type transistor shown in FIG. 4. However, in a P-type transistor, regions 408 and 412 would be P-type (e.g., positive type) regions and the substrate 404 would be an N-substrate (e.g., a negative type substrate).

Figure 5A:
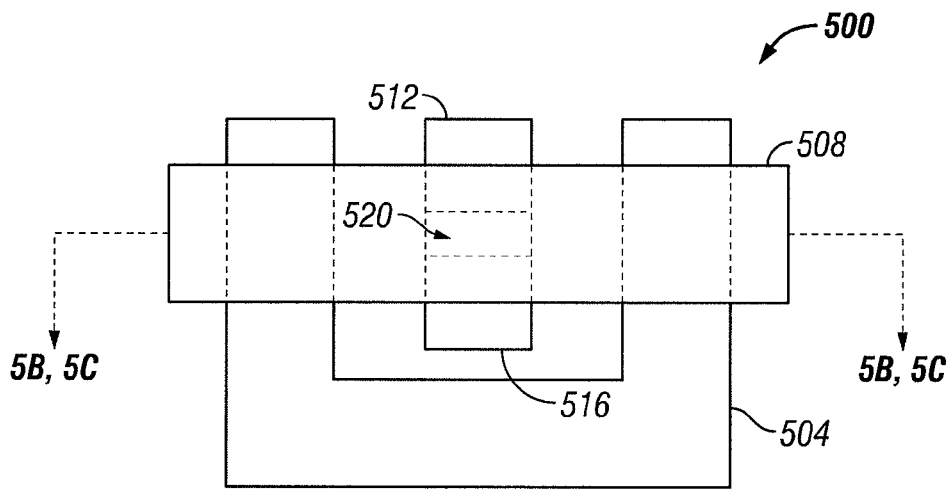
FIG. 5A is a top view of an exemplary transistor.

FIG. 5A is a top view of a second exemplary transistor 500 in a capacitive EMS device. The transistor 500 may be, for example, a metal-oxide-semiconductor field-effect transistor (MOSFET). The transistor 500 may be used for a variety of functions including but not limited to amplifying and/or switching electronic signals. The transistor 500 includes an electrode 504. A gate (e.g., a movable layer) 508 is positioned above the electrode 504. The transistor also includes two N-type (e.g., negative type) regions 512 and 516, which are located within the P-substrate 524 shown in FIG. 5B. In one implementation, the N-type region 512 may be coupled to a drain terminal (not shown in figure) and the N-type region 516 may be coupled to a source terminal (not shown in figure) . The electrode 504 may be coupled to a voltage source (not shown in figure). The source terminal (not shown in figure) may also be coupled to a voltage source (not shown in figure). The N-type regions 512 and 516 may be located within a P-substrate 524 (shown in FIGS. 5B through 5C). The transistor channel 520 is positioned between the N-Type regions 512 and 516. The region under the moveable layer 508 may include a dielectric 530 (shown in FIGS. 5B through 5C).

As shown in this Figure, the source 516, drain 512, and channel 520 of the transistor are centrally located under the moveable layer 508, and the electrode 504 is placed on at least two sides of these transistor elements. This arrangement assures that the moveable layer 508 is sensitive to potential differences between the electrode 504 and moveable gate 508, and that the use of the electrode 504 to position the gate does not unduly affect the operation of the transistor.

Although the electrode 504 is shown as a single "U" shaped segment, other implementations may use a variety of shapes or a different number of electrodes. The electrode may totally surround regions 512 and 516. As another example, there may be two rectangular shaped electrodes, one on either side of the N-type regions 512 and 516. In another implementation, two square shaped electrodes may be placed on either side of the N-type regions 512 and 516. In a further implementation, more than two electrodes may be placed around the N-type regions 512 and 516. For example, three or four electrodes may be positioned on the sides and above and below the N-type regions 512 and 516.

In addition, different implementations may orient the placement of the gate 508 and/or the electrode 504 in different ways. For example, in one implementation, the gate 504 may be positioned to extend vertically across the transistor 500, rather then horizontally across the transistor as shown in FIG. 5A. In another implementation, the electrode 504 may also be positioned such that it forms a "C" shape rather than a "U" shape as shown in FIG. 5A.

Figure 5B:
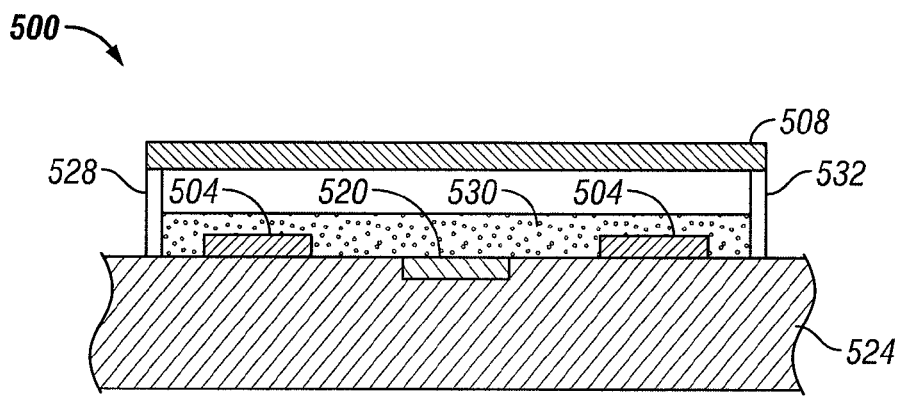
FIG. 5B is a vertical cross section of the exemplary transistor of FIG. 5A in a relaxed state.

FIG. 5B is a vertical cross section of the second exemplary transistor 500 of FIG. 5A in a relaxed state. The gate 508 is positioned above the electrode 504, the conductive channel 520, and the N-Type regions 512 and 516 (shown in FIG. 5A). The gate is held in place via posts 528 and 532. The N-type regions 512 and 516 are positioned within a P-substrate 524. The electrode 504 is positioned above the P-substrate 524, the N-type regions 512 and 516, and the conductive channel 520. The electrode 504 is also positioned below the gate 508.

In other implementations, the electrode 504, the N-type regions 512 and 516, and the conductive channel 520 may be placed in different locations. For example, in one implementation, the electrode 504, the N-type regions 512 and 516, and the conductive channel 520 may all be positioned within the P-substrate 524. In another implementation, the electrode 504, the N-type regions 512 and 516, and the conductive channel 520 may all be positioned above the P-substrate 524. In yet another implementation, the electrode 504, and the N-type regions 512, 516, may be positioned above the P-substrate 524, but the conductive channel 520 may be positioned within the P-substrate 524.

In FIG. 5B, the transistor 500 may be in an "off" state or an "inactive" state or a "relaxed" state. In this state, less electric current may flow through the conductive channel 520 between N-type regions 512 and 516 (e.g., an electric current cannot flow between N-type regions 512 and 516). It may be noted that while the gate is farther from the channel in this relaxed state, there may still be electric current flowing between the regions 512 and 516 through the channel when voltages are appropriately applied on the gate, source and drain terminals. The current depends on the capacitance between the gate and the channel, and in the relaxed state, there is still some capacitance between them.

Figure 5C:
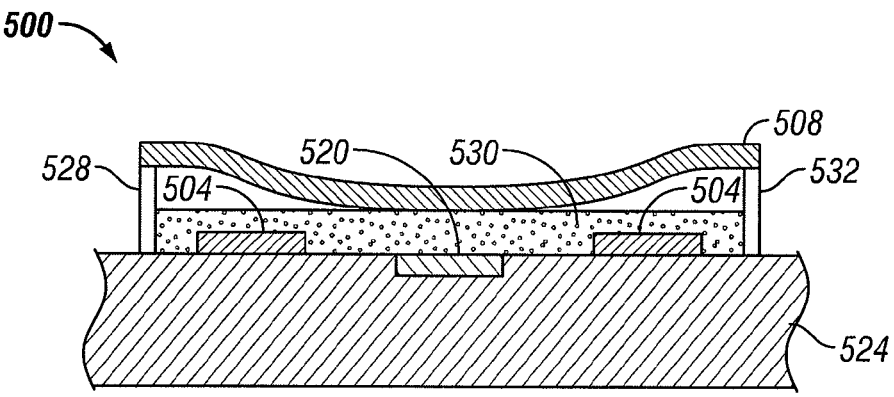
FIG. 5C is a vertical cross section of the exemplary transistor of FIG. 5A in an actuated state.

FIG. 5C is a vertical cross section of the second exemplary transistor 500 of FIG. 5A in an actuated state. In FIG. 5C, a voltage differential is present between the gate 508 and the electrode 504. The voltage differential between the gate 508 and the electrode 504 may be present due to a voltage applied at one or both of the gate 508 and the electrode 504. For example, in one implementation, a voltage may be applied at the gate 508 and ground voltage may be applied at the electrode 504. In another implementation, a voltage may be applied at the electrode 504 and ground voltage may be applied at the gate 508. In yet another implementation, a first voltage may be applied at the electrode 504 and a second voltage (which may be higher or lower then the first voltage) is applied at the gate 508. When the voltage differential is present between the gate 508 and the electrode 504, electrostatic forces may cause the gate 508 (e.g., a movable layer) to deform and/or move towards the electrode 504. If the voltage differential between the gate 508 and the electrode 504 is subsequently removed, the gate 508 (e.g., a movable layer) returns to a mechanically relaxed state as shown in FIG. 5B. The gate 508, acting like a spring, returns to the mechanically relaxed state due to a mechanical restorative force (i.e., a spring force) exerted by the gate 508 due to its deflection. In one implementation, the gate 508 may be movable into two positions (e.g., the relaxed position shown in FIG. 5B and the actuated position shown in FIG. 5C). In another implementation, the gate 508 may be movable into any position between the relaxed position shown in FIG. 5B and the actuated position shown in FIG. 5C. For example, the gate 508 may only be partial deformed and/or moved towards the electrode 504. The closer the gate 508 is moved (e.g., deformed or deflected) towards the electrode 504, the closer the gate 508 is positioned to the conductive channel 520, and more electric current may flow through the conductive channel 520. In FIG. 5C, the transistor 500 may be in an "on" state or an "active" state or an "actuated" state. In this state, electric current may flow through the conductive channel 520 between N-type regions 512 and 516, as similarly described in FIG. 4B.

Although FIGS. 5A through 5C are directed towards an N-type transistor, the implementations described herein may be applicable to P-type transistors. A P-type transistor is similar to the N-type transistor shown in FIGS. 5A through 5C. However, in a P-type transistor, regions 512 and 516 would be P-type (e.g., positive type) regions and the substrate 524 would be an N-substrate (e.g., a negative type substrate).

The transistor 500 shown in FIGS. 5A through 5C has multiple transistor characteristics. Examples of transistor characteristics include but are not limited to drain current, transconductance, cut-off frequency, breakdown voltage, leakage current, and the capacitance between at least two of the source, gate, and drain of the transistor 500. Any of these parameters may be affected by the position of the moveable layer 508.

In one implementation, the transistor of FIGS. 5A-5C is utilized in a feedback circuit. The feedback circuit may control the amount of voltage applied at the electrode 504 and/or the gate 508. The feedback circuit may modify the amount of voltage applied at the electrode 504 and/or the gate 508 based at least in part on one or more transistor characteristics. For example, the feedback circuit (not shown in figure) may increase and/or decrease the voltage applied at the electrode 504 and/or the gate 508 based on the drain current. In another implementation, the feedback circuit may increase and/or decrease the voltage applied at the electrode 504 and/or the gate 508 based on the drain current and the leakage current.

In one implementation, the increase and/or decrease in the voltage applied at the electrode 504 and/or the gate 508 may increase and/or decrease the distance between the gate 508 and the conductive channel 520. After fabrication of the transistor 500, the initial distance between the gate 508 and the electrode 504 may be changed based on at least one transistor characteristic. For example, following fabrication of the transistor 500, the distance between the gate 508 and the electrode 504 may be decreased based on the leakage current measured for the transistor 500. After the initial distance between the gate 508 and the conductive channel 520 has been changed to a final distance, the final distance may be substantially fixed.

While the above detailed description has shown, described and pointed out novel features of the disclosure as applied to various implementations, it will be understood that various omissions, substitutions, and changes in the form and details of the modulator or process illustrated may be made by those skilled in the art without departing from the spirit of the disclosure. As will be recognized, the present disclosure may be embodied within a form that does not provide all of the features and benefits set forth herein, as some features may be used or practiced separately from others.

What is claimed is:

1. A field effect transistor comprising:
    a moveable gate supported by at least two posts and configured to deform centrally between the at least two posts;
    a source;
    a drain;
    a doped semi-conductor channel disposed between the source and the drain and located under the movable gate; and
    one or more electrodes disposed on at least two sides of the source, the drain and the doped semi-conductor channel and configured to drive the moveable gate towards the doped semi-conductor channel.

2. The transistor of claim 1, wherein the one or more electrodes drive the movable gate towards the doped semi-conductor channel when a voltage difference is present between the one or more electrodes and the moveable gate.

3. The transistor of claim 1, the doped semi-conductor channel conducts an electric current when the movable gate is driven towards the doped semi-conductor channel.

4. The transistor of claim 1, wherein at least one transistor characteristic is based at least in part on a distance between the moveable gate and the doped semi-conductor channel.

5. The transistor of claim 1, wherein the at least one transistor characteristic comprises at least one of a drain current, transconductance, a cut-off frequency, a breakdown voltage, a leakage current, and a capacitance between at least two of the source, gate and drain of the field effect transistor.

6. The transistor of claim 4, wherein the drain current increases as the distance between the moveable gate and the doped semi-conductor channel decreases.

7. The transistor of claim 1, wherein the one or more electrodes is further configured to drive the movable gate towards the one or more electrodes.

8. The transistor of claim 1, wherein the one or more electrodes is further configured to drive the moveable gate towards at least one of the source and the drain.

9. The transistor of claim 1, wherein the moveable gate is driven towards the doped semi-conductor channel due to an electrostatic force.

10. The transistor of claim 1, wherein the moveable gate is positioned above the drain, the source, and the doped semi-conductor channel and wherein the one or more electrodes is positioned below the moveable gate.

11. The transistor of claim 1, wherein a distance between the movable gate and the doped semi-conductor channel is changed and substantially fixed after the fabrication of the transistor, and wherein the change is based at least in part on at least one transistor characteristic.

12. The transistor of claim 1, wherein the distance between the movable gate and the doped semi-conductor channel is varied based at least in part on an electrical signal.

13. The transistor of claim 12, wherein the electrical signal is based on, at least in part, an electrical feedback circuit.

14. The transistor of claim 1, wherein a spring force of the moveable gate drives the moveable gate away from the doped semi-conductor channel.

15. A method of operating a field effect transistor, the method comprising electrostatically moving a gate of said transistor toward a source, a drain and a doped semi-conductor channel of said transistor, wherein the gate is supported by at least two posts and is configured to deform centrally towards the source, the drain, and the doped semiconductor channel, and wherein one or more electrodes are disposed on at least two sides of the source, the drain and the dope semi-conductor channel.

16. The method of claim 15, wherein the gate is moved towards or away from the doped semi-conductor channel due to the voltage difference between the one or more electrodes and the gate.

17. The method of claim 15, the doped semi-conductor channel conducts an electric current when the movable gate is driven towards the doped semi-conductor channel.

18. The method of claim 15, wherein at least one of a drain current, transconductance, and a cut-off frequency of the field effect transistor is based at least in part on a distance between the moveable gate and the doped semi-conductor channel.

19. The method of claim 18, comprising increasing the drain current as the distance between the gate and the doped semi-conductor channel decreases.

20. The method of claim 15, comprising moving the gate towards the one or more electrodes.

21. The method of claim 15, further comprising moving the gate towards at least one of a source and a drain.

22. The method of claim 15, further comprising moving the gate away from the source, the drain, and the doped semiconductor channel based on a spring force of the gate.

23. A field effect transistor comprising:
    a moveable gate supported by at least two posts and configured to deform centrally between the at least two posts;
    a source;
    a drain;
    a doped semi-conductor channel disposed between the source and the drain and located under the movable gate; and
    means for moving the gate towards or away from the doped semi-conductor channel, wherein the moving means is disposed on at least two sides of the source, the drain and the doped semi-conductor channel.

24. The transistor of claim 23, wherein the moving means comprises one or more electrodes.

25. The transistor of claim 23, wherein the moving means uses an electrostatic force to move the gate towards the doped semi-conductor channel.

26. The transistor of claim 23, wherein the doped semi-conductor channel conducts an electric current when the movable gate is moved towards the doped semi-conductor channel.

27. The transistor of claim 21, wherein a spring force of the moveable gate drives the moveable gate away from the doped semi-conductor channel.

* * * * *